United States Patent
Hasuda

(10) Patent No.: US 8,674,324 B2
(45) Date of Patent: Mar. 18, 2014

(54) CHARGED PARTICLE BEAM APPARATUS AND SAMPLE TRANSPORTING APPARATUS

(71) Applicant: Hitachi High-Tech Science Corporation, Tokyo (JP)

(72) Inventor: Masakatsu Hasuda, Tokyo (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/839,862

(22) Filed: Mar. 15, 2013

(65) Prior Publication Data

US 2013/0240730 A1  Sep. 19, 2013

(30) Foreign Application Priority Data

Mar. 16, 2012 (JP) .................................. 2012-060963

(51) Int. Cl.
*H01J 37/20* (2006.01)
(52) U.S. Cl.
USPC ............ 250/442.11; 250/440.11; 250/441.11; 250/492.1; 250/492.21
(58) Field of Classification Search
USPC .............. 250/440.11, 441.11, 442.11, 443.11
See application file for complete search history.

(56) References Cited

U.S. PATENT DOCUMENTS

| | | | | |
|---|---|---|---|---|
| 3,679,900 A | * | 7/1972 | Kimura | 250/441.11 |
| 4,020,353 A | * | 4/1977 | Saito et al. | 250/441.11 |
| 4,405,865 A | * | 9/1983 | Genty et al. | 250/442.11 |
| 5,214,290 A | * | 5/1993 | Sakai | 250/492.2 |
| 5,229,615 A | * | 7/1993 | Brune et al. | 250/492.2 |
| 5,367,171 A | * | 11/1994 | Aoyama et al. | 250/443.1 |
| 5,753,923 A | * | 5/1998 | Mera et al. | 250/443.1 |
| 5,898,179 A | * | 4/1999 | Smick et al. | 250/492.21 |
| 6,246,060 B1 | * | 6/2001 | Ackeret et al. | 250/442.11 |
| 6,580,082 B1 | * | 6/2003 | Mitchell | 250/492.2 |
| 6,838,685 B1 | * | 1/2005 | Kodama et al. | 250/492.21 |
| 7,015,483 B2 | * | 3/2006 | Suzuki et al. | 250/311 |
| 7,075,076 B2 | * | 7/2006 | Makino et al. | 250/310 |
| 7,205,554 B2 | * | 4/2007 | Tokuda et al. | 250/492.1 |
| 7,544,957 B2 | * | 6/2009 | Walther et al. | 250/492.21 |
| 7,550,750 B2 | * | 6/2009 | Tokuda et al. | 250/492.21 |
| 7,718,981 B2 | * | 5/2010 | Takahashi et al. | 250/492.21 |
| 7,863,564 B2 | * | 1/2011 | Tsuneta et al. | 250/306 |
| 8,455,824 B2 | * | 6/2013 | Muto et al. | 250/310 |
| 2004/0251413 A1 | * | 12/2004 | Suzuki et al. | 250/309 |
| 2005/0098737 A1 | * | 5/2005 | Cipriani et al. | 250/442.11 |
| 2011/0226947 A1 | * | 9/2011 | Takahashi et al. | 250/307 |
| 2013/0248733 A1 | * | 9/2013 | Nomaguchi et al. | 250/396 R |

OTHER PUBLICATIONS

JEOL Application Data Sheet (IB-A-001-00), "Overview of FIB", 2010, pp. 1-2 (with partial English translation).

* cited by examiner

*Primary Examiner* — David A Vanore
(74) *Attorney, Agent, or Firm* — Adams & Wilks

(57) ABSTRACT

A charged particle beam apparatus includes: a sample chamber; a sample stage; an electron beam irradiation system for irradiating the sample with an electron beam; a focused ion beam irradiation system for irradiating the sample with a focused ion beam; a sample stage drive unit having a rotational axis orthogonal to at least one of an irradiation axis of the electron beam irradiation system and an irradiation axis of the focused ion beam irradiation system; and a sample transporting mechanism for transporting the sample to the sample stage. The sample transporting mechanism includes a transportation path provided in the sample stage drive unit in a direction parallel to the rotational axis of the sample stage drive unit, and is configured to transport the sample to the sample stage through the transportation path.

12 Claims, 9 Drawing Sheets

CHARGED PARTICLE BEAM APPARATUS AND SAMPLE TRANSPORTING APPARATUS

This application claims priority from Japanese Patent Application No. 2012-060963 filed on Mar. 16, 2012, the entire subject-matter of which is incorporated herein by reference.

BACKGROUND OF THE INVENTION

1. Field of the Invention

The present invention relates to a charged particle beam apparatus and a sample transporting apparatus.

2. Description of the Related Art

As a charged particle beam apparatus, there have been proposed a charged particle beam apparatus including a sample chamber adjustable to produce a vacuum inside, a sample stage for holding a sample inside the sample chamber, a focused ion beam irradiation system for irradiating the sample with a focused ion beam to process the sample, and a scanning electron microscope including an electron beam irradiation system for irradiating the processed surface of the sample with an electron beam to observe and analyze the sample. Such an apparatus has an advantage in that the sample can be processed with the focused ion beam, and observed and analyzed with the electron beam in situ, that is, in the same sample chamber without moving the sample to other apparatus.

The above-mentioned process for the sample is performed in the vacuum of the sample chamber, but a given length of time is required to produce a vacuum inside the sample chamber. In view of the above, there is known a charged particle beam apparatus including an auxiliary sample chamber connected to the sample chamber. The auxiliary sample chamber is arranged to maintain the succeeding sample in a standby state, and the gas in the sample atmosphere is discharged in advance to produce a vacuum, with the result that the succeeding sample can be introduced into the sample chamber quickly. In this case, the sample chamber is provided with a sample transporting mechanism for transporting the sample from the auxiliary sample chamber.

In the sample chamber, a large number of process units other than the above-mentioned focused ion beam irradiation system and electron beam irradiation system are arranged around the sample and oriented to one point of the sample depending on the purpose of the process for the sample. From the viewpoint of expanding functions and enhancing process efficiency of the charged particle beam apparatus, it is preferred to install as many process units in the sample chamber as possible. Further, it is preferred that the space in the sample chamber be utilized as effectively as possible.

When the sample transporting mechanism for transporting the sample from the auxiliary sample chamber is to be provided inside the sample chamber, however, the space for installing the sample transporting mechanism needs to be ensured, which leads to an adverse effect that the installation of other process units is restricted.

SUMMARY OF THE INVENTION

Illustrative aspects of the present invention provide a charged particle beam apparatus and a sample transporting mechanism, which are capable of expanding functions and enhancing process efficiency as a result of eliminating restriction on process units inside a sample chamber.

According to one illustrative aspect of the present invention, there is provided a charged particle beam apparatus, including: a sample chamber adjustable to produce a vacuum inside thereof; a sample stage configured to hold a sample inside the sample chamber; an electron beam irradiation system configured to irradiate the sample held by the sample stage with an electron beam; a focused ion beam irradiation system configured to irradiate the sample held by the sample stage with a focused ion beam; a secondary signal detector configured to detect a secondary signal generated from the sample through the irradiation of at least one of the electron beam and the focused ion beam; a sample stage drive unit having a rotational axis that is orthogonal to at least one of an irradiation axis of the electron beam irradiation system and an irradiation axis of the focused ion beam irradiation system; and a sample transporting mechanism configured to transporting the sample to the sample stage. The sample transporting mechanism includes a transportation path provided in the sample stage drive unit in a direction parallel to the rotational axis of the sample stage drive unit. The sample transporting mechanism is configured to transport the sample to the sample stage through the transportation path.

With this configuration, the sample is transported to the sample stage through the transportation path provided in the direction parallel to the rotational axis of the sample stage drive unit, and hence the sample transporting mechanism can be arranged in the same port as that for the sample stage drive unit. Thus, even when the sample transporting mechanism is provided, the sample transporting mechanism does not occupy the space in the sample chamber, with the result that the restriction on other process units can be eliminated. Thus, it is possible to provide the charged particle beam apparatus capable of expanding functions and enhancing process efficiency.

In the above-mentioned charged particle beam apparatus, the sample transporting mechanism may further include: an auxiliary sample chamber adjustable to produce a vacuum inside thereof; a gate valve configured to open and close between the auxiliary sample chamber and the transportation path; and a transportation tool configured to transport the sample from the auxiliary sample chamber to the sample stage, which is provided inside the sample chamber, through the transportation path when the gate valve is opened.

In the above-mentioned charged particle beam apparatus, the transportation tool may include a gripper portion configured to grip at least one of the sample and a sample holder.

In the above-mentioned charged particle beam apparatus, the transportation tool may be rotatable with respect to an axis parallel to the rotational axis of the sample stage drive unit so as to mount the at least one of the sample and the sample holder gripped by the gripper portion on the sample stage.

In the above-mentioned charged particle beam apparatus, the sample stage drive unit may include: a rotary mechanism configured to rotate together with the sample stage with respect to the rotational axis; and a stationary mechanism configured to prevent at least the auxiliary sample chamber and the gate valve from rotating due to the rotary mechanism.

In the above-mentioned charged particle beam apparatus, the sample stage drive unit may further include a vacuum seal provided between the rotary mechanism and the stationary mechanism.

In the above-mentioned charged particle beam apparatus, the sample stage may be configured to drive in at least one of: three axial directions orthogonal to one another; a rotational direction with respect to an axis that is orthogonal to a vertical direction and the rotational axis of the sample stage drive unit; and a rotational direction with respect to an axis in a direction of the irradiation axis of the electron beam irradiation system.

In the above-mentioned charged particle beam apparatus, the at least one of the irradiation axis of the electron beam irradiation system and the irradiation axis of the focused ion beam irradiation system may be set to match with the vertical direction. The rotational axis of the sample stage drive unit may be orthogonal to the vertical direction.

In the above-mentioned charged particle beam apparatus, the electron beam irradiation system may be arranged such that an irradiation axis of the electron beam matches with a vertical direction. Further, the focused ion beam irradiation system may be arranged such that an irradiation axis of the focused ion beam crosses the irradiation axis of the electron beam. Further, the sample stage drive unit may be arranged such that the rotational axis of the sample stage drive unit is orthogonal to the irradiation axis of the electron beam and the irradiation axis of the focused ion beam.

In order to solve the above-mentioned problem, according to another illustrative aspect of the present invention, there is provided a sample transporting apparatus configured to transport a sample to a sample stage for irradiating the sample, which is held by the sample stage inside a sample chamber that is adjustable to produce a vacuum inside thereof, with at least one charged particle beam and detecting a secondary signal that is generated from the sample through the irradiation of the at least one charged particle beam, the sample transporting apparatus including: a sample stage drive unit having: a rotational axis orthogonal to an irradiation axis of the at least one charged particle beam; and a transportation path provided in a direction parallel to the rotational axis. The sample transporting apparatus is configured to transport the sample to the sample stage through the transportation path.

With this configuration, the sample is transported to the sample stage through the transportation path provided in the direction parallel to the rotational axis of the sample stage drive unit, and hence the sample transporting apparatus can be arranged in the same port as that for the sample stage drive unit. Thus, even when the sample transporting apparatus is provided, the sample transporting mechanism does not occupy the space in the sample chamber, with the result that the restriction on other process units can be eliminated. Thus, it is possible to provide the sample transporting apparatus capable of expanding functions and enhancing process efficiency.

The above-mentioned sample transporting apparatus may further include an auxiliary sample chamber adjustable to produce a vacuum inside thereof.

The above-mentioned sample transporting apparatus may further include: a gate valve configured to open and close between the auxiliary sample chamber and the transportation path; and a transportation tool configured to transport the sample from the auxiliary sample chamber to the sample stage, which is provided inside the sample chamber, through the transportation path when the gate valve is opened.

According to the illustrative aspects of the invention, it is possible to provide the charged particle beam apparatus and the sample transporting apparatus, which are capable of expanding functions and enhancing process efficiency as a result of eliminating the restriction on the process units inside the sample chamber.

DETAILED DESCRIPTION

In the following, an exemplary embodiment of the present invention will be described with reference to the accompanying drawings, but the scope of claims for the present invention is not limited to the following embodiment, and all the combinations of features described in the embodiment are not essential as the solving means of the present invention. Note that, in the respective figures, the same components are represented by the same reference symbols, and redundant description thereof is therefore omitted herein.

Figure 1:
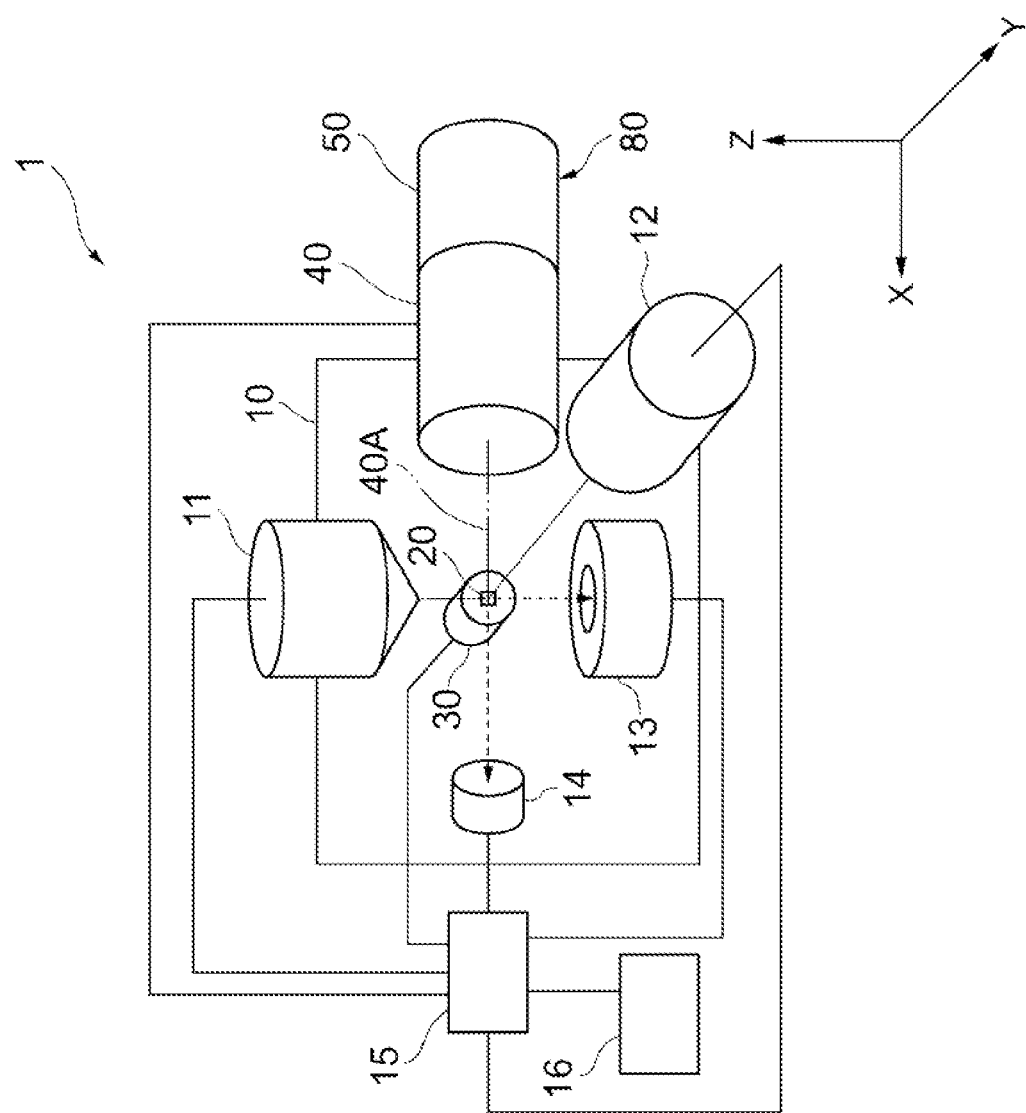
FIG. 1 is an explanatory view illustrating a charged particle beam apparatus according to an embodiment of the present invention.

FIG. 1 is a schematic view of a charged particle beam apparatus according to this embodiment. A charged particle beam apparatus 1 according to this embodiment includes a sample chamber 10 adjustable to produce a vacuum inside, an electron beam irradiation system 11 for irradiating a sample with an electron beam, a focused ion beam irradiation system 12 for irradiating the sample with a focused ion beam, a secondary signal detector 14, a sample stage 30, a sample stage drive unit 40, and a sample transporting mechanism 80. Those process units are each arranged around the sample and oriented to one point of the sample so that at least a part of the process unit is located inside the sample chamber 10. Note that, other process units, such as a scanning transmission electron detector 13, an energy dispersive X-ray spectrometer, and a backscattered electron diffraction detector, may further be arranged inside the sample chamber 10.

The electron beam irradiation system 11 irradiates a region of a sample 20 with the electron beam to scan the surface of the sample 20. For example, the electron beam irradiation system 11 is arranged so that an irradiation axis of the electron beam matches with a vertical direction (in the example of FIG. 1, Z-axis direction). On the other hand, the focused ion beam irradiation system 12 irradiates the electron beam irradiation region of the sample 20 with the focused ion beam to provoke removal of the surface of the sample 20 or growth of the surface, to thereby provide a processed surface to the sample 20. For example, the focused ion beam irradiation system 12 is arranged so that an irradiation axis of the focused ion beam matches with a horizontal direction (in the example of FIG. 1, Y-axis direction) orthogonal to the vertical direction. That is, the irradiation axis of the focused ion beam from the focused ion beam irradiation system 12 is orthogonal to the irradiation axis of the electron beam from the electron beam irradiation system 11.

The electron beam irradiation system 11 irradiates the surface of the sample 20 with the electron beam to scan the surface of the sample 20, and the secondary signal detector 14 detects a secondary signal (for example, electron or X-ray) generated from the sample 20 as a result of the scanning. Further, the electron beam from the electron beam irradiation system 11 passes through the sample 20, and the transmission electron detector 13 arranged to be opposed to the electron beam irradiation system 11 in the Z-axis direction detects a transmission electron generated as a result of the passage of the electron beam. The signals detected by the respective detectors are transmitted to a control unit 15, and accordingly an observation image of the surface of the sample is obtained. The observation image is displayed on a display unit 16, and accordingly a result of processing the sample can be confirmed.

The secondary signal detector 14 detects a secondary signal generated from the sample through the irradiation of at least one of the electron beam and the focused ion beam. Examples of the secondary signal detector 14 include an energy dispersive X-ray spectrometer, a secondary electron detector, and a backscattered electron diffraction detector. The secondary signal detector 14 may be arranged at a predetermined position in relation to the arrangement of other process units. For example, when the secondary signal detector 14 is a backscattered electron diffraction detector, as illustrated in FIG. 1, the secondary signal detector 14 is arranged at a position for receiving the secondary signal generated from the sample 20 from a direction orthogonal to each of the irradiation axis of the electron beam from the electron beam irradiation system 11 and the irradiation axis of the focused ion beam from the focused ion beam irradiation system 12.

Next, description is given of the sample stage, the sample stage drive unit, and the sample transporting mechanism according to this embodiment.

Figure 2:
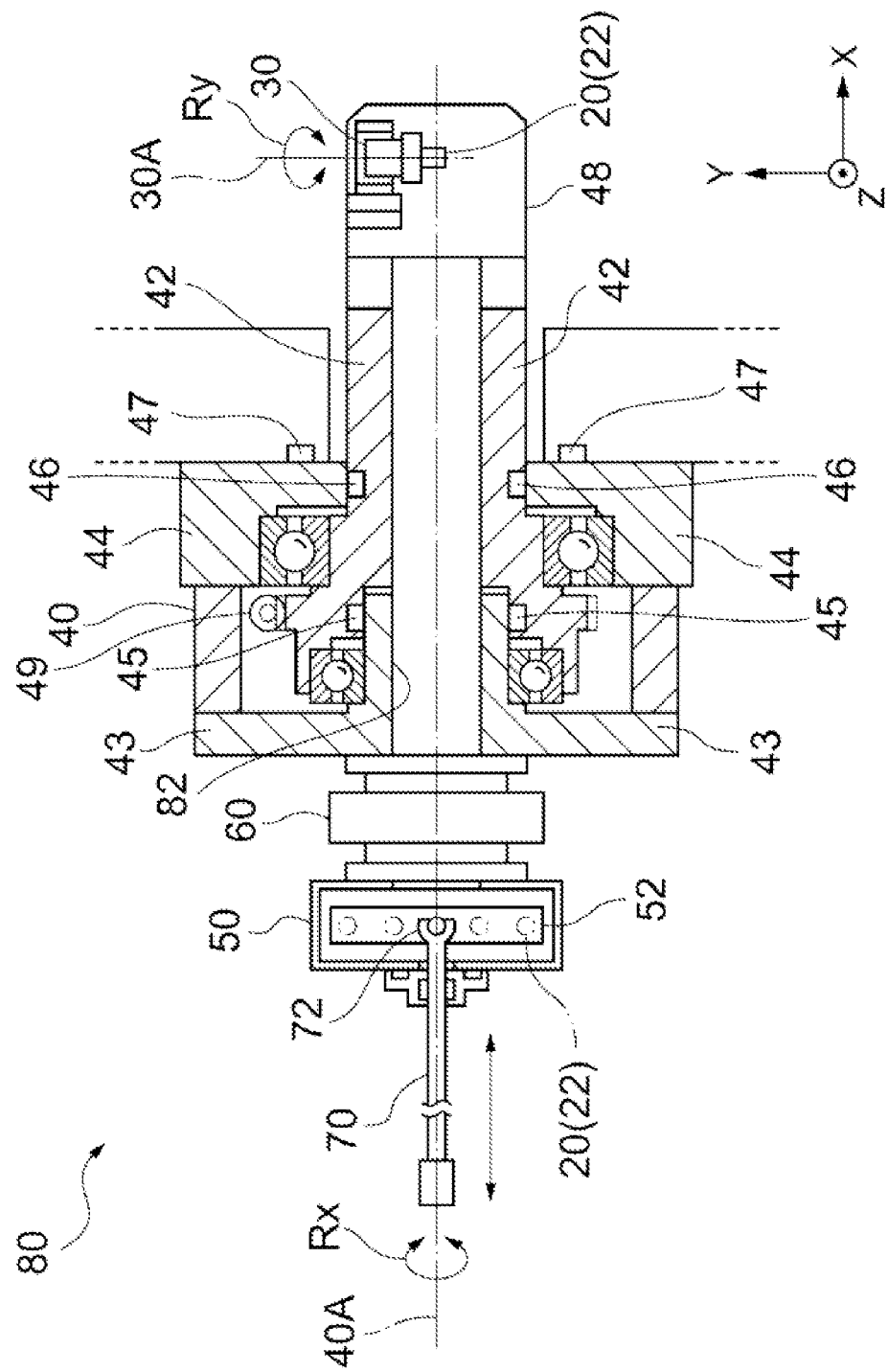
FIG. 2 is an explanatory view illustrating a sample stage, a sample stage drive unit, and a sample transporting mechanism according to the embodiment of the present invention.
Figure 3:
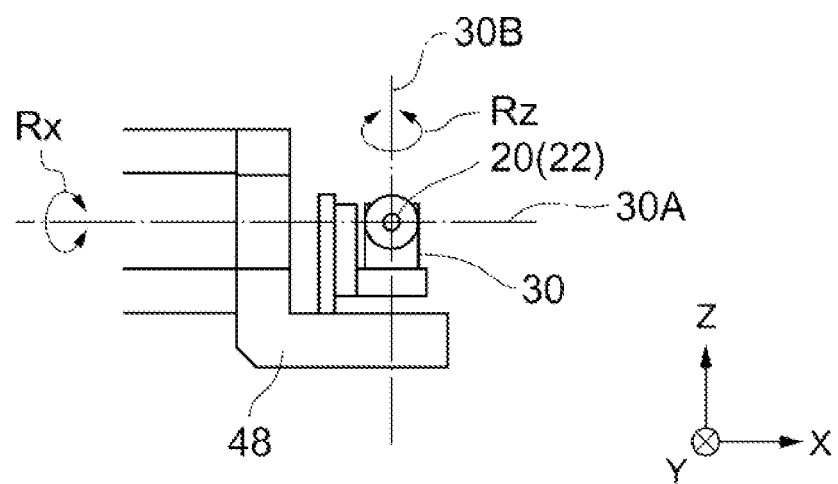
FIG. 3 is a view illustrating the sample stage according to the embodiment of the present invention.

FIG. 2 is a view of the sample stage, the sample stage drive unit, and the sample transporting mechanism as seen from the Z-axis direction. FIG. 3 is a view of the sample stage as seen from the Y-axis direction. Note that, for convenience of the description, a part of the apparatus is omitted from the respective figures.

The sample stage 30 holds the sample 20 inside the sample chamber 10. Specifically, the sample stage 30 holds the sample 20 through use of a sample holder 22 described later. Further, the sample stage 30 is drivable in at least one of the X-, Y-, and Z-axis directions orthogonal to one another, a rotational direction Ry with respect to a rotational axis 30A in the Y-axis direction (see FIG. 2), and a rotational direction Rz with respect to a rotational axis 30B in the Z-axis direction (see FIG. 3). In other words, the sample stage 30 is configured to appropriately adjust a translational position of the sample 20 in the X-, Y-, and Z-axis directions, a rotational position of the sample 20 in an XY plane, and/or a tilt of the sample 20 in an XZ plane with respect to the Z-axis.

The sample stage drive unit 40 includes a support portion 48 for supporting the sample stage 30, and is drivable in a rotational direction Rx with respect to a rotational axis 40A in the X-axis direction so as to move the sample stage 30 through the support portion 48. That is, the sample stage drive unit 40 is configured to appropriately adjust a tilt of the sample 20 in a YZ plane with respect to the Z-axis. For example, when the rotational axis 40A of the sample stage drive unit 40 is set orthogonal to the irradiation axis of the focused ion beam irradiation system 12, the sample stage drive unit 40 is driven in the rotational direction Rx to enable adjustment of the irradiation angle of the focused ion beam irradiation system 12 for the sample 20.

Further, the sample stage drive unit 40 includes a rotary mechanism 42 and stationary mechanisms 43 and 44. The rotary mechanism 42 rotates together with the sample stage 30 in the rotational direction Rx with respect to the rotational axis 40A, and on the other hand, the stationary mechanisms 43 and 44 maintain themselves stationary without rotation even when the sample stage 30 and the rotary mechanism 42 rotate as described above. Vacuum seals 45, 46, and 47 are provided between the rotary mechanism 42 and the stationary mechanisms 43 and 44 so as to maintain the vacuum state inside the sample chamber 10, and accordingly, even when the rotary mechanism 42 of the sample stage drive unit 40 rotates, the vacuum inside the sample chamber 10 can be maintained. Further, the sample stage drive unit 40 is provided with a rotary gear 49 for rotating the rotary mechanism 42.

The sample transporting mechanism 80 transports the sample 20 to the sample stage 30. The sample transporting mechanism 80 includes a transportation path 82 provided in the sample stage drive unit 40, and transports the sample 20 to the sample stage 30 through the transportation path 82. The transportation path 82 is provided in a direction parallel to the rotational axis 40A of the sample stage drive unit 40. Specifically, the transportation path 82 has a cross-section in the YZ plane which is sized so that the sample 20, the sample holder 22, and a transportation tool 70 described later can pass therethrough, and extends in the X-axis direction toward the sample stage 30.

In the example of FIG. 2, the transportation path 82 is provided so that the rotational axis 40A is located inside the transportation path 82. Accordingly, the sample can be transported only through, for example, the movement in the X-axis direction, with the result that the mechanism for transporting the sample can be simplified.

The sample transporting mechanism 80 further includes an auxiliary sample chamber 50 adjustable to produce a vacuum inside, a gate valve 60, and the transportation tool 70. The gate valve 60 is openable and closable between the auxiliary sample chamber 50 and the transportation path 82 (sample stage drive unit 40). Further, the gate valve 60 is connected to the stationary mechanism 43 of the sample stage drive unit 40. Accordingly, as described above, the stationary mechanism 43 maintains itself stationary even when the sample stage 30 and the rotary mechanism 42 are rotationally driven, and hence it is possible to prevent the gate valve 60 and the auxiliary sample chamber 50 as well as piping and wiring connected thereto from rotating along with the rotational drive.

Figure 4:
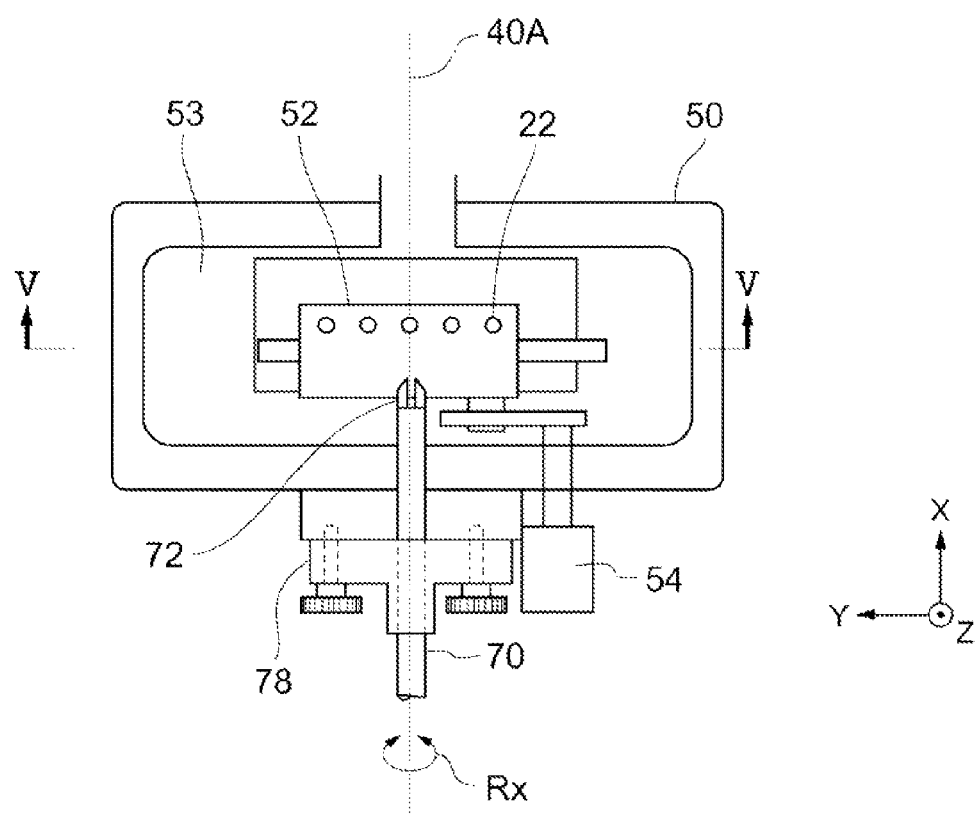
FIG. 4 is a view illustrating an auxiliary sample chamber according to the embodiment of the present invention.
Figure 5:
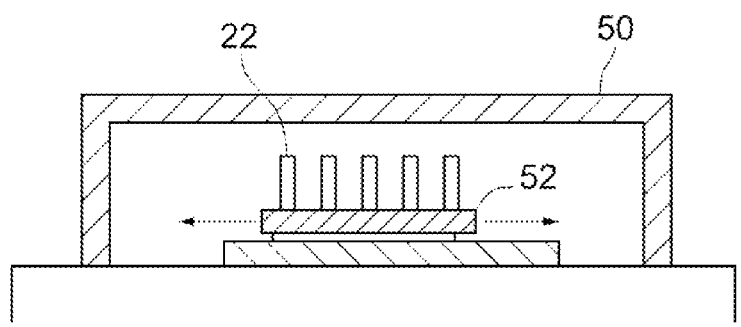
FIG. 5 is a cross-sectional view taken along the line V-V of FIG. 4.

Now, the auxiliary sample chamber according to this embodiment will be described. FIG. 4 is a view illustrating the auxiliary sample chamber according to this embodiment. FIG. 5 is a cross-sectional view taken along the line V-V of FIG. 4.

As illustrated in FIG. 2, the auxiliary sample chamber 50 is connected to the transportation path 82 through an intermediation of the gate valve 60. That is, in the charged particle beam apparatus 1, the auxiliary sample chamber 50, the gate valve 60, the sample stage drive unit 40 (transportation path 82), and the sample stage 30 are arranged in line in the X-axis direction toward the sample 20. Of those components, the gate valve 60 and the auxiliary sample chamber 50 are arranged outside the sample chamber 10.

The auxiliary sample chamber 50 includes an auxiliary sample stage 52 for mounting thereon at least one set of the sample 20 and the sample holder 22. The auxiliary sample stage 52 is arranged inside the auxiliary sample chamber 50, and an operator can visually recognize the sample 20 on the auxiliary sample stage 52 through a transparent window 53 provided in a top surface of the auxiliary sample chamber 50. A plurality of sets (in FIGS. 4 and 5, five sets) of the sample 20 and the sample holder 22 may be mounted on the auxiliary sample stage 52. As illustrated in FIG. 5, when the sample holder 22 is formed into a substantially columnar shape (see FIGS. 8A to 8D as well), for example, the sample holder 22 is mounted on the auxiliary sample stage 52 with its longitudinal direction matching with the Z-axis direction. Note that, the sample 20 is omitted from FIGS. 4 and 5.

Further, the auxiliary sample chamber 50 includes an auxiliary sample stage drive unit 54 for moving the auxiliary sample stage 52. With the auxiliary sample stage drive unit 54, the sample 20 and the sample holder 22 on the auxiliary sample stage 52 can be moved in the Y direction. For example, as illustrated in FIG. 4, when the respective sets of the sample 20 and the sample holder 22 are arranged in line in the Y-axis direction, the auxiliary sample stage drive unit 54 is capable of driving the auxiliary sample stage 52 in the Y-axis direction. Accordingly, of the plurality of samples 20 on the auxiliary sample stage 52, a sample 20 to be transported by the transportation tool 70 can be moved onto the rotational axis 40A by the auxiliary sample stage drive unit 54.

Figure 6:
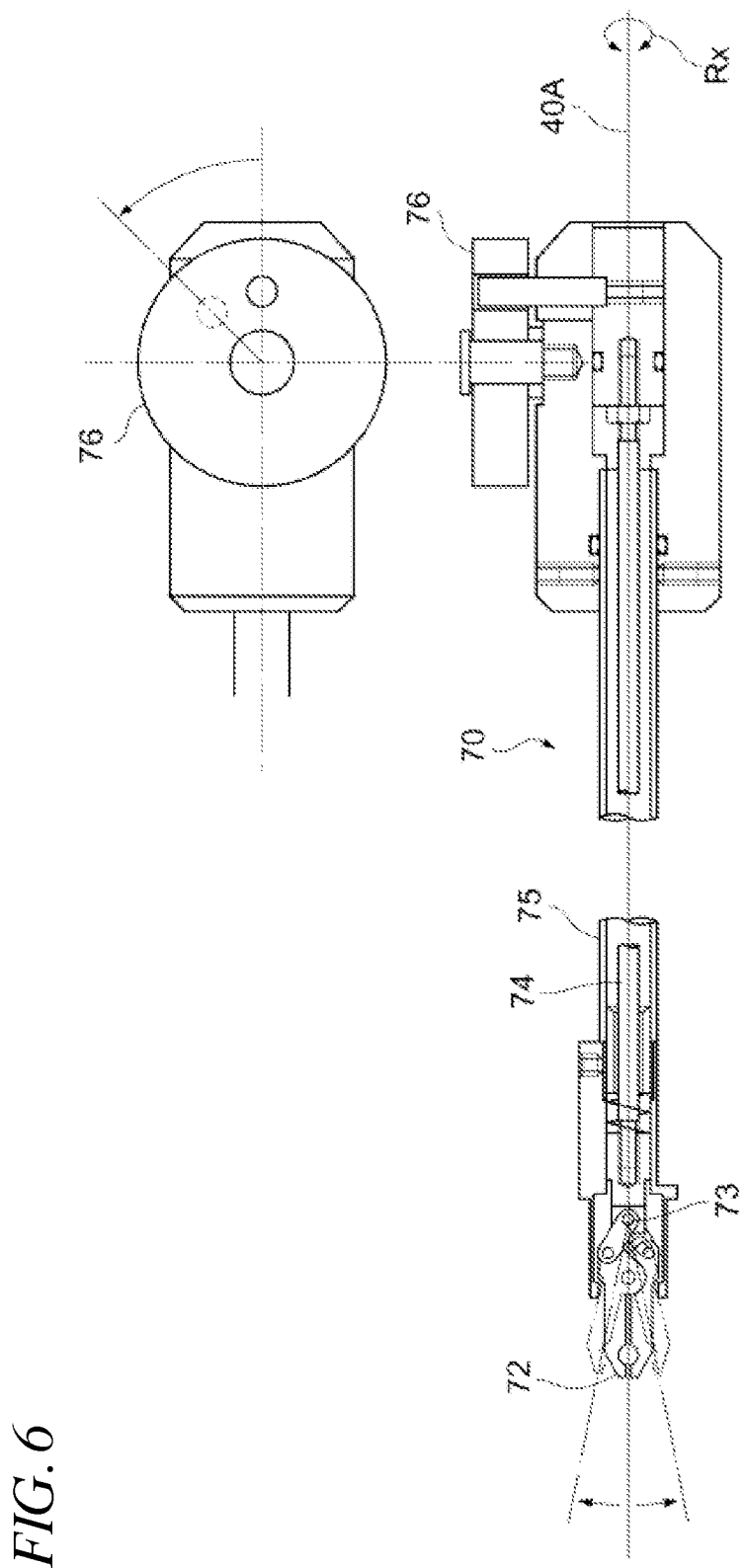
FIG. 6 is a view illustrating a transportation tool according to the embodiment of the present invention.
Figure 7:
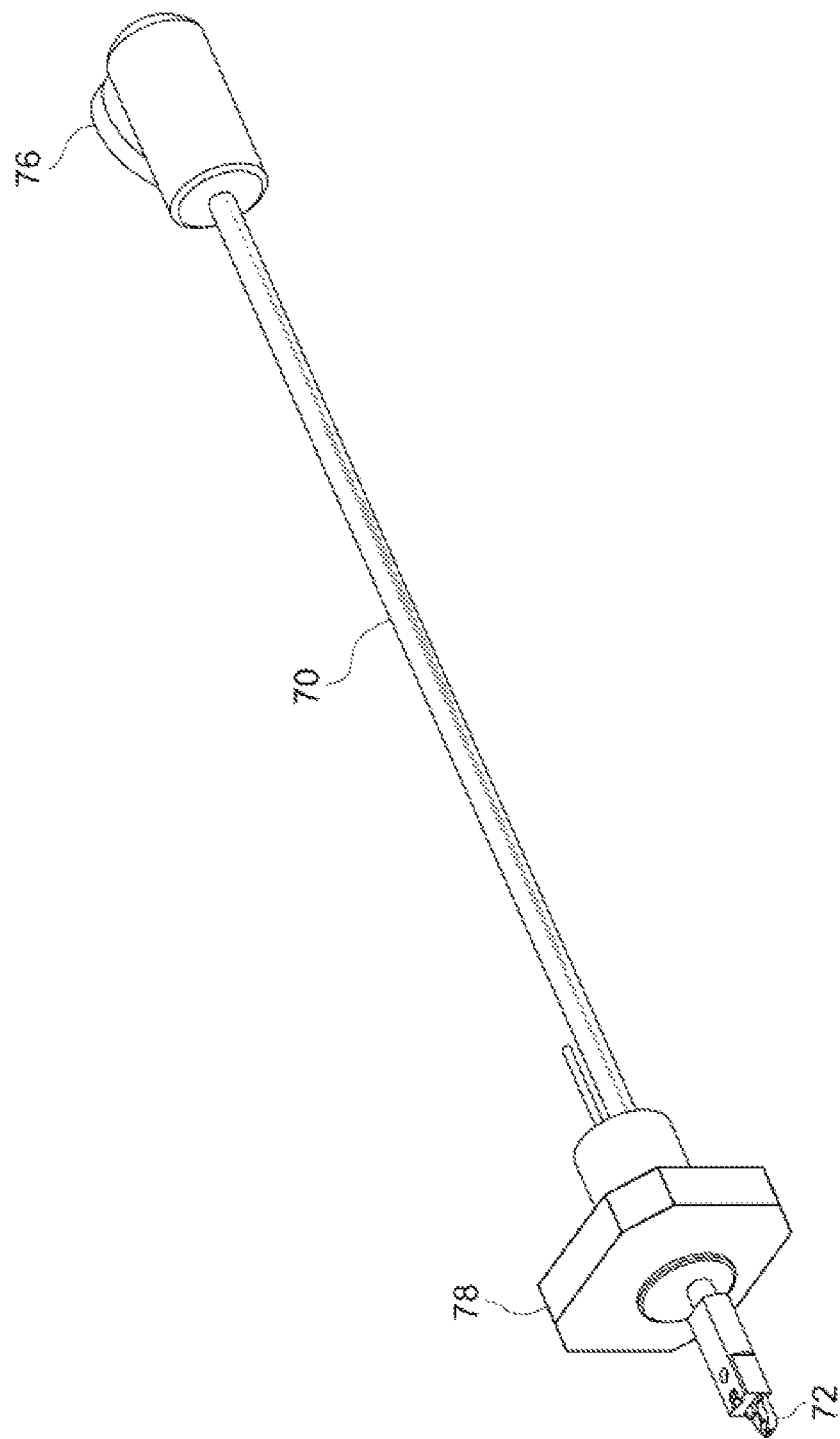
FIG. 7 is a view illustrating an outer appearance of the transportation tool according to the embodiment of the present invention.
Figure 8A:
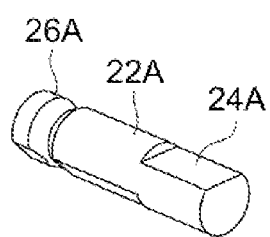
FIGS. 8A, 8B, 8C, and 8D are views illustrating a sample holder according to the embodiment of the present invention.
Figure 8B:
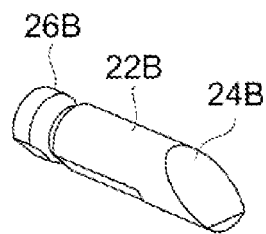
Figure 8C:
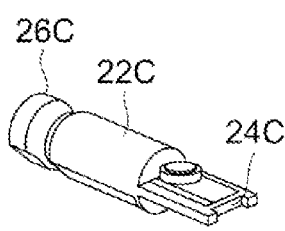
Figure 8D:
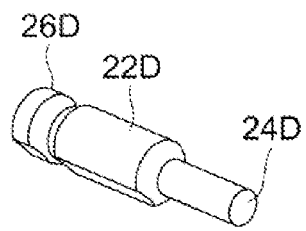

Next, the transportation tool according to this embodiment will be described. FIG. 6 is a view illustrating the transportation tool according to this embodiment. FIG. 7 is a view illustrating an outer appearance of the transportation tool.

The transportation tool 70 is drivable in the X-axis direction, and is drivable along a path matching with, for example, the rotational axis 40A of the sample stage drive unit 40. When the transportation tool 70 is moved in the X-axis direction, the succeeding sample 20 can be transported from the auxiliary sample chamber 50 to the sample chamber 10 through the transportation path 82, or the preceding sample 20 can be transported from the sample chamber 10 to the auxiliary sample chamber 50 through the transportation path 82. Further, the transportation tool 70 is drivable in the rotational direction Rx with respect to an axis (for example, rotational axis 40A) parallel to the rotational axis 40A. Such rotational drive of the transportation tool 70 is used for mounting the sample 20 and/or the sample holder 22 on the sample stage 30 or removing the sample 20 and/or the sample holder 22 from the sample stage 30. Note that, the transportation tool 70 may be drivable in the rotational direction Rx in, for example, 90-degree increments.

The transportation tool 70 includes a gripper portion 72 for gripping the sample 20 and/or the sample holder 22, and an inner shaft 74, an outer shaft 75, and an operation portion 76 for opening and closing the gripper portion 72. The inner shaft 74 and the outer shaft 75 each extend in the direction of the rotational axis 40A, and have one end coupled to the gripper portion 72 and the other end coupled to the operation portion 76. The inner shaft 74 is configured to move relative to the outer shaft 75. For example, as illustrated in FIG. 6, when the operation portion 76 is rotated by a predetermined angle with respect to an axis orthogonal to the rotational axis 40A, the inner shaft 74 may be moved in a first direction (for example, direction away from the gripper portion 72), and accordingly a link 73 coupled to the inner shaft 74 may be moved in the first direction, to thereby open the gripper portion 72 in its lateral direction.

Further, the transportation tool 70 may include fixing means 78 (see FIG. 7) connected to the auxiliary sample chamber 50. As illustrated in FIG. 4, the fixing means 78 is configured to fix the transportation tool 70 to the auxiliary sample chamber 50 with screws or the like, and a part of the transportation tool 70 on the operation portion 76 side of the fixing means 78 is arranged outside the auxiliary sample chamber 50.

Figure 9:
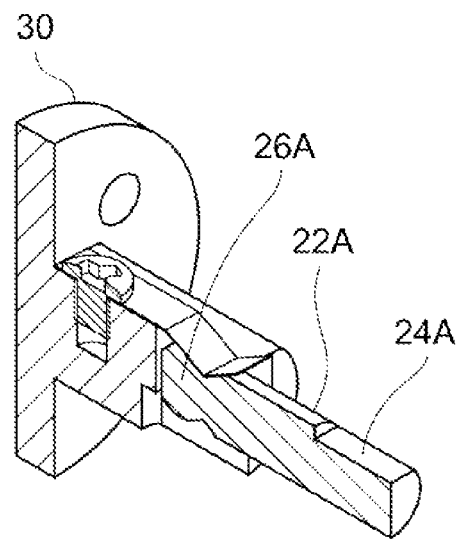
FIG. 9 is a view illustrating a state in which the sample holder is mounted on the sample stage according to the embodiment of the present invention.

Next, an operation of the transportation tool according to this embodiment will be described. FIGS. 8A to 8D are views illustrating the sample holder. FIG. 9 is a view illustrating a state in which a sample holder 22A according to one mode of this embodiment is mounted on the sample stage.

First, the sample holder 22 having the sample 20 adhered thereto is mounted on the auxiliary sample stage 52 inside the auxiliary sample chamber 50. Specifically, the auxiliary sample chamber 50 is set to an atmospheric pressure inside, and in this state, the sample holder 22 is mounted on the auxiliary sample stage 52. Note that, there is no limitation on how to mount the sample holder 22. For example, the sample holder 22 may be mounted with its longitudinal direction matching with the Z-axis direction (see FIG. 5).

Further, there is no limitation on the shape and structure of the sample holder 22. As illustrated in FIGS. 8A to 8D, various sample holders may be employed depending on the kind of the sample and the purpose of the process. For example, sample holders 22A to 22D respectively include sample placing regions 24A to 24D for placing the sample 20, and fitting portions 26A to 26D to be fitted to the sample stage 30. Angles and sizes of the sample placing regions 24A to 24D are determined in consideration of the kind of a sample to be placed, the direction of irradiation of a charged particle beam for the sample, the direction of reflection of a secondary signal to be generated through the irradiation, and the like.

Subsequently, the gas in the atmosphere of the auxiliary sample chamber 50 is discharged to produce a vacuum under a state in which the sample 20 and the sample holder 22 are arranged inside the auxiliary sample chamber 50. After that, the gate valve 60 is opened to communicate the transportation path 82 and the auxiliary sample chamber 50 to each other, and the sample 20 and the sample holder 22 are transported from the auxiliary sample chamber 50 to the sample stage 30 inside the sample chamber 10 through the transportation path 82.

First, as illustrated in FIG. 4, the sample holder 22 is visually recognized through the transparent window 53 of the auxiliary sample chamber 50, and in a case where the sample holder 22 to be transported is not located on the movement direction of the transportation tool 70, the sample holder 22 on the auxiliary sample stage 52 is moved in the Y-axis direction by the auxiliary sample stage drive unit 54 such that the sample holder 22 is located on the movement direction of the transportation tool 70 (on the rotational axis 40A). Then, the sample holder 22 is gripped by the gripper portion 72 of the transportation tool 70. At this time, the sample holder 22 is gripped by the transportation tool 70 with its longitudinal direction matching with the Z-axis direction. When the sample holder 22 is gripped, the transportation tool 70 moves the sample holder 22 in the X-axis direction (rotational axis 40A) toward the sample stage 30, to thereby move the sample holder 22 to the position of the sample stage 30. After that, the transportation tool 70 is rotated by about 90 degrees in the rotational direction Rx with respect to the rotational axis 40A, to thereby change the longitudinal direction of the sample holder 22 from the Z-axis direction to the Y-axis direction. Then, the fitting portion 26 of the sample holder 22 is fitted to the sample stage 30. Note that, when the preceding sample holder 22 is mounted on the sample stage 30, it is only necessary that the transportation tool 70 be used to temporarily remove the sample holder 22 and return the sample holder 22 to the auxiliary sample chamber 50, and then the transportation tool 70 be used to transport the succeeding sample holder 22 from the auxiliary sample chamber 50 to the sample stage 30 and mount the sample holder 22 on the sample stage 30.

As described above, according to the charged particle beam apparatus and the sample transporting apparatus of this embodiment, the sample is transported to the sample stage through the transportation path provided in the direction parallel to the rotational axis of the sample stage drive unit, and hence the sample transporting mechanism can be arranged in the same port as that for the sample stage drive unit. Thus, even when the sample transporting mechanism is provided, the sample transporting mechanism does not occupy the space in the sample chamber, with the result that the restriction on other process units can be eliminated. Thus, it is possible to provide the charged particle beam apparatus and the sample transporting apparatus which are capable of expanding functions and enhancing process efficiency.

Note that, the combination and arrangement of the process units are not limited to those in the configuration illustrated in FIG. 1, and may be determined as appropriate depending on the purpose of the process for the sample. For example, the focused ion beam irradiation system 12 is not necessarily arranged orthogonal to the electron beam irradiation system 11, but for example, the focused ion beam irradiation system 12 may be arranged at an angle less than 90 degrees from the electron beam irradiation system 11. In this case, the electron beam irradiation system 11 may be arranged so that the irradiation axis of the electron beam matches with the vertical direction, and on the other hand, the focused ion beam irradiation system 12 may be arranged so that the irradiation axis of the focused ion beam corresponds to an oblique direction, and vice versa.

The examples and application examples described by way of the above-mentioned embodiment of the present invention may be employed through appropriate combination, change, or modification depending on the intended use, and the present invention is not limited to the description of the above-mentioned embodiment. It is understood that the scope of claims is to be accorded the broadest interpretation so that the technical scope of the present invention encompasses all such combination, change, and modification.

What is claimed is:

1. A charged particle beam apparatus, comprising:
a sample chamber adjustable to produce a vacuum inside thereof;
a sample stage configured to hold a sample inside the sample chamber;
an electron beam irradiation system configured to irradiate the sample held by the sample stage with an electron beam;
a focused ion beam irradiation system configured to irradiate the sample held by the sample stage with a focused ion beam;
a secondary signal detector configured to detect a secondary signal generated from the sample through the irradiation of at least one of the electron beam and the focused ion beam;
a sample stage drive unit having a rotational axis that is orthogonal to at least one of an irradiation axis of the electron beam irradiation system and an irradiation axis of the focused ion beam irradiation system; and
a sample transporting mechanism configured to transport the sample to the sample stage,
wherein the sample transporting mechanism comprises a transportation path provided in the sample stage drive unit in a direction parallel to the rotational axis of the sample stage drive unit, and wherein the sample transporting mechanism is configured to transport the sample to the sample stage through the transportation path.

2. The charged particle beam apparatus according to claim 1, wherein the sample transporting mechanism further comprises:
an auxiliary sample chamber adjustable to produce a vacuum inside thereof;
a gate valve configured to open and close between the auxiliary sample chamber and the transportation path; and
a transportation tool configured to transport the sample from the auxiliary sample chamber to the sample stage, which is provided inside the sample chamber, through the transportation path when the gate valve is opened.

3. The charged particle beam apparatus according to claim 1,
wherein the transportation tool comprises a gripper portion configured to grip at least one of the sample and a sample holder.

4. The charged particle beam apparatus according to claim 3,
wherein the transportation tool is rotatable with respect to an axis that is parallel to the rotational axis of the sample stage drive unit so as to mount the at least one of the sample and the sample holder gripped by the gripper portion on the sample stage.

5. The charged particle beam apparatus according to claim 2, wherein the sample stage drive unit comprises:
a rotary mechanism configured to rotate together with the sample stage with respect to the rotational axis; and
a stationary mechanism configured to prevent at least the auxiliary sample chamber and the gate valve from rotating due to the rotary mechanism.

6. The charged particle beam apparatus according to claim 5,
wherein the sample stage drive unit further comprises a vacuum seal provided between the rotary mechanism and the stationary mechanism.

7. The charged particle beam apparatus according to claim 1,
wherein the sample stage is configured to drive in at least one of: three axial directions orthogonal to one another; a rotational direction with respect to an axis that is orthogonal to a vertical direction and the rotational axis of the sample stage drive unit; and a rotational direction with respect to an axis in the vertical direction.

8. The charged particle beam apparatus according to claim 1,
wherein the at least one of the irradiation axis of the electron beam irradiation system and the irradiation axis of the focused ion beam irradiation system is set to match with the vertical direction, and
wherein the rotational axis of the sample stage drive unit is orthogonal to the vertical direction.

9. The charged particle beam apparatus according to claim 1,
wherein the electron beam irradiation system is arranged such that an irradiation axis of the electron beam matches with a vertical direction,
wherein the focused ion beam irradiation system is arranged such that an irradiation axis of the focused ion beam crosses the irradiation axis of the electron beam, and
wherein the sample stage drive unit is arranged such that the rotational axis of the sample stage drive unit is orthogonal to the irradiation axis of the electron beam and the irradiation axis of the focused ion beam.

10. A sample transporting apparatus configured to transport a sample to a sample stage for irradiating the sample, which is held by the sample stage inside a sample chamber that is adjustable to produce a vacuum inside thereof, with at least one charged particle beam and detecting a secondary signal that is generated from the sample through the irradiation of the at least one charged particle beam, the sample transporting apparatus comprising:
- a sample stage drive unit having: a rotational axis orthogonal to an irradiation axis of the at least one charged particle beam; and a transportation path provided in a direction parallel to the rotational axis,
- wherein the sample transporting apparatus is configured to transport the sample to the sample stage through the transportation path.

11. The sample transporting apparatus according to claim 10, further comprising:
- an auxiliary sample chamber adjustable to produce a vacuum inside thereof.

12. The sample transporting apparatus according to claim 11, further comprising:
- a gate valve configured to open and close between the auxiliary sample chamber and the transportation path; and
- a transportation tool configured to transport the sample from the auxiliary sample chamber to the sample stage, which is provided inside the sample chamber, through the transportation path when the gate valve is opened.

* * * * *